(12) United States Patent
Yu et al.

(10) Patent No.: US 12,302,709 B2
(45) Date of Patent: May 13, 2025

(54) DISPLAY DEVICE, DISPLAY PANEL, AND MANUFACTURING METHOD THEREFOR

(71) Applicant: BOE TECHNOLOGY GROUP CO., LTD., Beijing (CN)

(72) Inventors: Yang Yu, Beijing (CN); Fangxu Cao, Beijing (CN); Pinfan Wang, Beijing (CN); Wenqiang Li, Beijing (CN); Bo Wang, Beijing (CN); Jingquan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 413 days.

(21) Appl. No.: 17/781,056

(22) PCT Filed: May 20, 2021

(86) PCT No.: PCT/CN2021/094920
§ 371 (c)(1),
(2) Date: May 31, 2022

(87) PCT Pub. No.: WO2022/001466
PCT Pub. Date: Jan. 6, 2022

(65) Prior Publication Data
US 2022/0415982 A1 Dec. 29, 2022

(30) Foreign Application Priority Data
Jun. 29, 2020 (CN) .......................... 202010610179.8

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 71/00* (2023.02);
(Continued)

(58) Field of Classification Search
CPC .... H10K 59/122; H10K 50/844; H10K 71/00; H10K 59/1201; H10K 59/35;
(Continued)

(56) References Cited

U.S. PATENT DOCUMENTS 9,577,222 B2   2/2017   Satoshi et al.
9,935,292 B2   4/2018   Satoshi et al.
(Continued)

FOREIGN PATENT DOCUMENTS

CN   107644588 A   1/2018
CN   109461833 A   3/2019
(Continued)

OTHER PUBLICATIONS

Definition of annulus downloaded from URL <https://www.merriam-webster.com/dictionary/annulus> on Apr. 22, 2024. (Year: 2024).*
(Continued)

*Primary Examiner* — J. E. Schoenholtz
(74) *Attorney, Agent, or Firm* — Calfee, Halter & Griswold LLP

(57) ABSTRACT

A display device, a display panel, and a manufacturing method therefor are provided. The display panel includes a flexible substrate, a display layer on one side of the flexible substrate, and an encapsulation layer covering a surface of the display layer away from the flexible substrate. The display layer has a stretching area provided with a plurality of pixel islands spaced apart and a through-hole. A blocking dam is in an area corresponding to the pixel island and surrounds a plurality of light-emitting units. The encapsulation layer includes an organic layer that is in the stretching area and confined within an annular area surrounded by the blocking dam.

19 Claims, 6 Drawing Sheets

(51) Int. Cl.
*H10K 59/12* (2023.01)
*H10K 59/35* (2023.01)
*H10K 71/00* (2023.01)
*H10K 77/10* (2023.01)
*H10K 102/00* (2023.01)

(52) U.S. Cl.
CPC ......... *H10K 59/1201* (2023.02); *H10K 59/35* (2023.02); *H10K 77/111* (2023.02); *H10K 2102/311* (2023.02)

(58) Field of Classification Search
CPC ............ H10K 77/111; H10K 2102/311; H10K 59/8731; H10K 59/873; H10K 59/352; G09F 9/301
See application file for complete search history.

(56) References Cited

U.S. PATENT DOCUMENTS

| | | | |
|---|---|---|---|
| 2016/0093678 A1 | 3/2016 | Satoshi et al. | |
| 2017/0155092 A1 | 6/2017 | Satoshi et al. | |
| 2019/0207155 A1* | 7/2019 | Lee | H10K 59/8731 |
| 2019/0267438 A1 | 8/2019 | Masashi et al. | |
| 2021/0098547 A1 | 4/2021 | Wu | |

FOREIGN PATENT DOCUMENTS

| | | | |
|---|---|---|---|
| CN | 208904069 | U | 5/2019 |
| CN | 109935730 | A | 6/2019 |
| CN | 110148679 | A | 8/2019 |
| CN | 110416266 | A | 11/2019 |
| CN | 110459583 | A | 11/2019 |
| CN | 110544712 | A | 12/2019 |
| CN | 110571247 | A | 12/2019 |
| CN | 110610968 | A | 12/2019 |
| CN | 110676302 | A | 1/2020 |
| CN | 111162197 | A | 5/2020 |
| JP | 2006159185 | A | 6/2006 |
| KR | 20160141127 | A | 12/2016 |
| WO | 2020192293 | A1 | 10/2020 |
| WO | 2021017986 | A1 | 2/2021 |

OTHER PUBLICATIONS

Definition of ring includes an encircling arrangement, downloaded from URL<htpps://www.merriam-webster.com/dictionary/ring> Aug. 2, 2016. (Year: 2016).*
International Search Report from PCT/CN2021/094920 dated Aug. 2, 2021.
Written Opinion from PCT/CN2021/094920 dated Aug. 2, 2021.
Office action from European Application No. 21833259.1 dated Jul. 6, 2023.

* cited by examiner

DISPLAY DEVICE, DISPLAY PANEL, AND MANUFACTURING METHOD THEREFOR

CROSS-REFERENCE TO RELATED APPLICATIONS

The present disclosure is the national stage entry of PCT/CN2021/094920, filed on May 20, 2021, which claims the priority of the Chinese Patent Application No. 202010610179.8, filed on Jun. 29, 2020, and titled "DISPLAY DEVICE, DISPLAY PANEL, AND MANUFACTURING THEREFOR," the entire contents of which are hereby incorporated by reference in their entirety.

TECHNICAL FIELD

The present disclosure relates to the field of display technology, and in particular, to a display device, a display panel, and a method for manufacturing a display panel.

BACKGROUND

At present, flexible display panels have been widely used in cell phones and other terminal devices, among which, flexible display panels with stretchable properties in parts or all areas can not only be bent, but also stretched. However, during the manufacturing process, the stretching performance may be affected due to technology, causing difficulties to stretch properly.

It should be noted that the information disclosed in the "BACKGROUND" section is intended only to enhance the understanding of the context of this disclosure and may therefore include information that does not constitute prior art known to those of ordinary skill in the art.

SUMMARY

The present disclosure provides a display device, a display panel, and a method for manufacturing a display panel.

According to an aspect of the present disclosure, there is provided a display panel, including a flexible substrate; a display layer, on one side the flexible substrate, having a stretching area, and including a pixel definition layer and a blocking dam, the blocking dam being in an annulus shape on a surface of the pixel definition layer away from the flexible substrate, where a plurality of pixel islands spaced apart and a through-hole between two pixel islands are in the stretching area; the pixel definition layer defines a plurality of light-emitting units; and the blocking dam is in an area of the pixel definition layer corresponding to one of the plurality of pixel islands and surrounding more than one light-emitting unit of the plurality of light-emitting units; and an encapsulation layer covering a surface of the display layer away from the flexible substrate and comprising an organic layer, where a portion of the organic layer in the stretching area is confined within an annular area surrounded by the blocking dam.

According to an aspect of the present disclosure, there is provided a method for manufacturing a display panel, including: providing a flexible substrate; forming a display layer on one side of the flexible substrate, where the display layer has a stretching area and includes a pixel definition layer and a blocking dam, the blocking dam being in an annulus shape on a surface of the pixel definition layer away from the flexible substrate; a plurality of pixel islands spaced apart are in the stretching area; the pixel definition layer defines a plurality of light-emitting units; and the blocking dam is in an area of the pixel definition layer corresponding to one of the plurality of pixel islands and surrounding more than one light-emitting unit of the plurality of light-emitting units; providing a through-hole between two pixel islands; and covering a surface of the display layer away from the flexible substrate with an encapsulation layer, where the encapsulation layer includes an organic layer, and a portion of the organic layer in the stretching area is confined within an annular area surrounded by the blocking dam.

According to an aspect of the present disclosure, there is provided a display device including the display panel as described in any one of the above embodiments.

It should be understood that both the foregoing general description and the following detailed description are exemplary and explanatory only and not for limiting the present disclosure.

BRIEF DESCRIPTION OF THE ACCOMPANYING DRAWINGS

Accompanying drawings herein, which are incorporated into and constitute a part of the specification, illustrate embodiments conforming to the present disclosure, and are used to explain the principles of the present disclosure in conjunction with the specification. It will be apparent that the accompanying drawings in the following description only show some of the embodiments of the present disclosure, and that other drawings may be obtained from them without any creative efforts by one of ordinary skill in the art.

DETAILED DESCRIPTION

Figure 1:
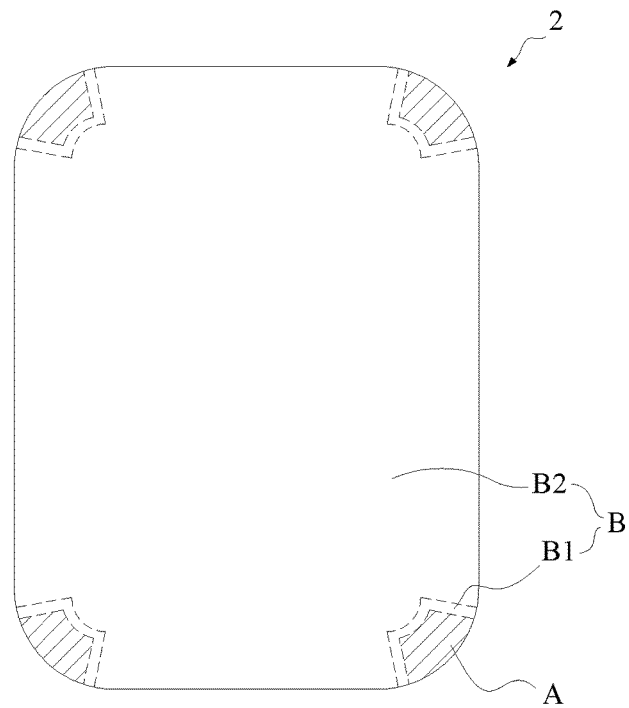
FIG. 1 illustrates a top view of a display layer in one embodiment for a display panel of the present disclosure.

Exemplary embodiments will now be described more fully with reference to the accompanying drawings. However, the exemplary embodiments may be implemented in various forms and should not be construed as limited to the examples set forth herein; rather, these embodiments are provided so that the present disclosure will be more comprehensive and complete, and will fully convey the concept of exemplary embodiments to those skilled in the art. The same reference numerals in the drawings indicate the same or similar structures, and thus their detailed description will be omitted. In addition, the accompanying drawings are merely schematic illustrations of the present disclosure and are not necessarily drawn to scale.

Although relative terms such as "up" and "down" are used in this specification to describe the relative relationship of one component of the icon to another, these terms are used in this specification only for convenience, for example, according to the orientation of the examples described in the accompanying drawings. It will be understood that if the device of the icon is flipped so that it is upside down, the component described as being "up" will become the component described as being "down". When a structure is "on" other structures, it may mean that the structure is integrally formed on other structures, or that the structure is "directly" set on other structures, or that the structure is "indirectly" set on other structures through another structure. The accompanying drawings are only schematic illustrations of the present disclosure and are not necessarily to scale.

The terms "a", "one", "the", "said" and "at least one" are used to indicate the presence of one or more elements/components/etc. The terms "includes" and "provided with/has" are used to indicate an open-ended inclusion and refer to the existence of additional elements/components/etc. in addition to the listed elements/components/etc. The terms "first", "second", etc. are used as markers only and are not quantitative limitations on their objects.

Embodiments of the present disclosure provide a display panel, as shown in FIGS. 1-4, which may include a flexible substrate 1, a display layer 2, and an encapsulation layer 3.

The display layer 2 is disposed on one side of the flexible substrate 1, and the display layer 2 may include a stretching area A. The stretching area A includes a plurality of pixel islands 100 spaced apart, and the space between the pixel islands 100 are provided with one or more through-holes 200.

The display layer 2 includes a pixel definition layer 23 and an annular blocking dam 25. The pixel definition layer 23 defines a plurality of light-emitting units 001. The blocking dam 25 is provided on a surface of the pixel definition layer 23 away from the flexible substrate 1. The blocking dam 25 is in an area corresponding to the pixel island 100 and surrounds more than one light emitting unit 001.

The encapsulation layer 3 covers a surface of the display layer 2 away from the flexible substrate 1, and includes an organic layer 31. A portion of the organic layer in the stretching area is confined with an annular area surrounded by the blocking dam 25.

In the display panel of the embodiments of the present disclosure, the through-hole 200 between the pixel islands 100 is used to make the stretching area A with stretchable performance, and the organic layer 31 of the encapsulation layer 3 located in the stretching area A can be restricted by the annular blocking dam 25 being in the area corresponding to the pixel islands 100 and surrounding the light-emitting units 001. In this case, the organic layer 31 used to encapsulate the pixel islands 100 is blocked by the blocking dam 25 and does not flow into the through-hole 200 between the pixel islands 100, avoiding a decrease in stretching performance or even failure to stretch caused by the organic layer 31 blocking the through-hole 200.

The following is a detailed description of the various parts of the display panel of the present disclosure.

Figure 4:
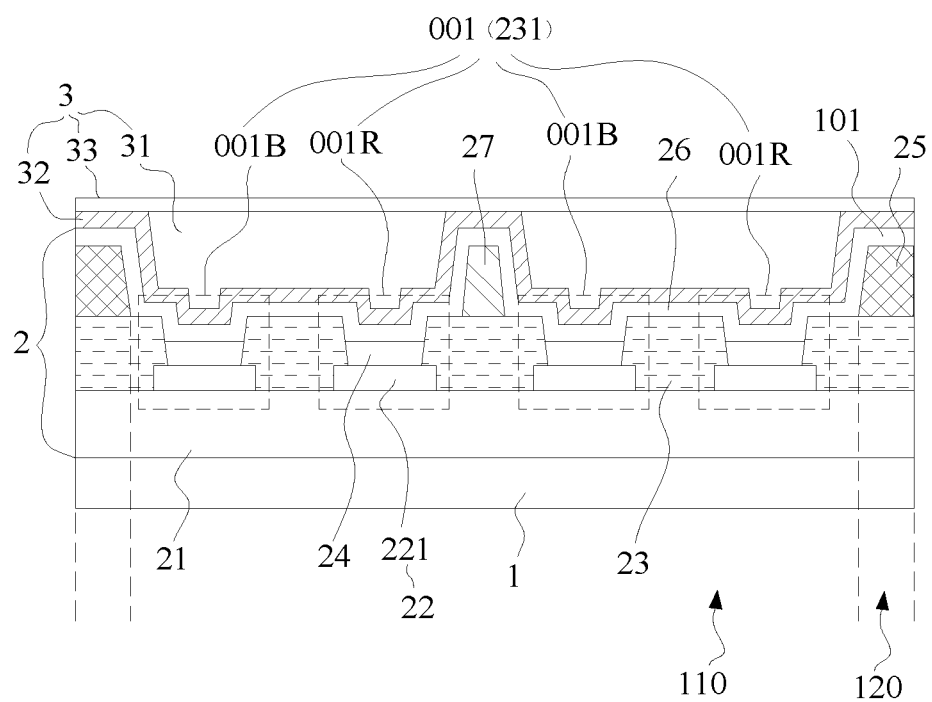
FIG. 4 illustrates a cross-sectional view of FIG. 2 in a C-C direction.

As shown in FIG. 4, the flexible substrate 1 is made of a flexible material, for example, the material can be polyimide (PI), polyethylene terephthalate (PET) or other flexible materials can also be used, without any special limitation here. The flexible substrate 1 can be a single-layer structure or a multi-layer structure, as long as it is flexible.

As shown in FIGS. 1-4, the display layer 2 is provided on the surface of one side of the flexible substrate 1 for emitting light to the side away from or near the flexible substrate 1 to display the image. In the case where the light needs to be emitted to the side close to the flexible substrate 1, the flexible substrate 1 needs to be made of a flexible transparent material.

Figure 2:
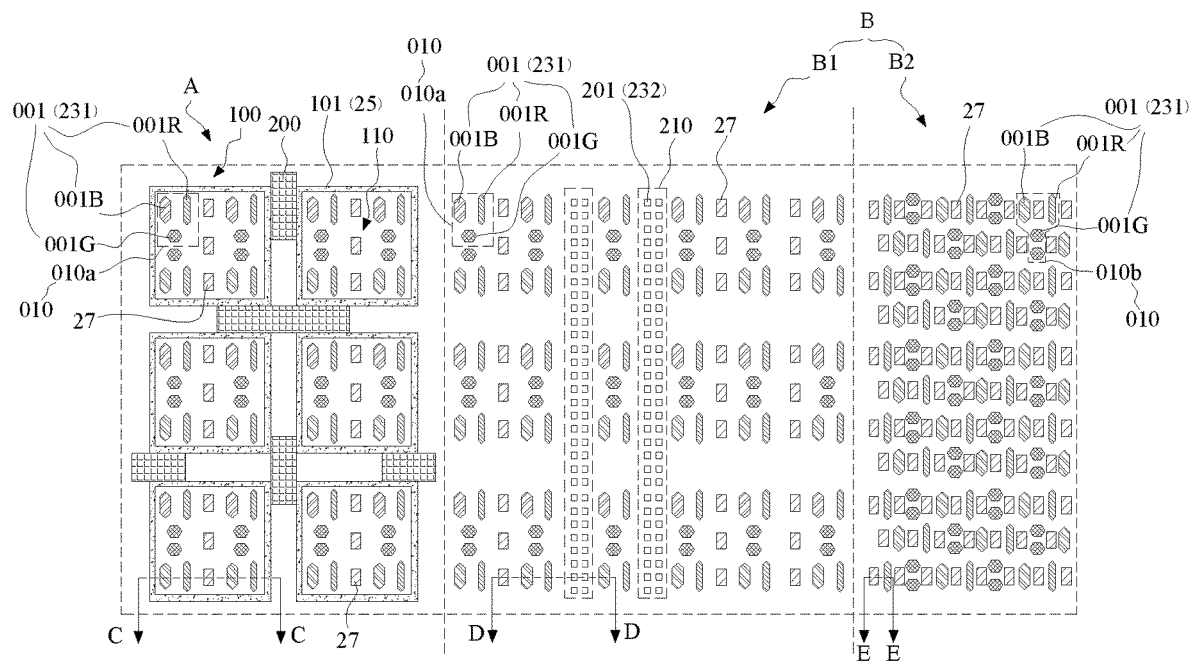
FIG. 2 illustrates a partially enlarged view of a display layer in one embodiment for the display panel of the present disclosure.
Figure 3:
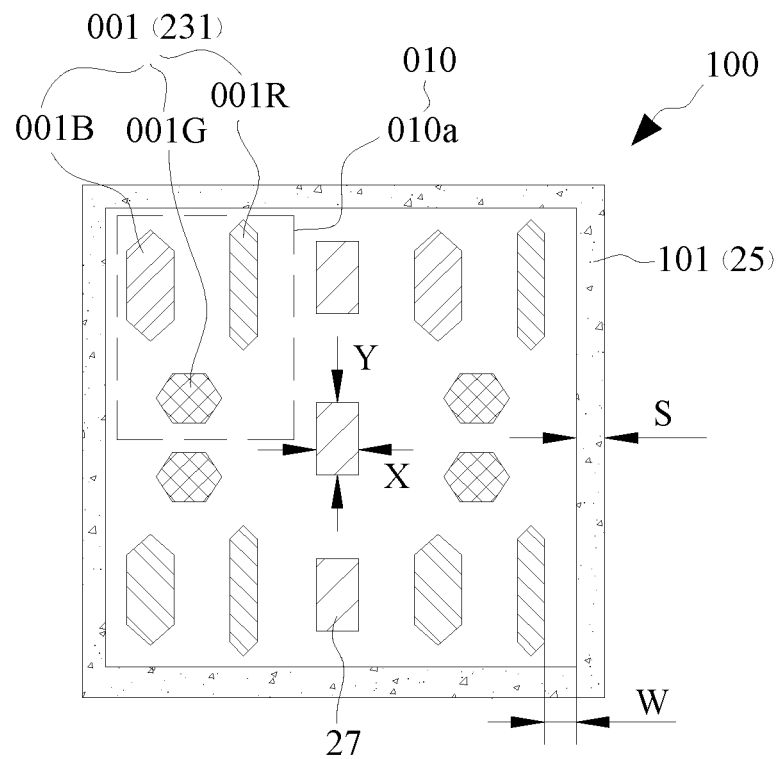
FIG. 3 illustrates a schematic diagram of the pixel distribution of a pixel island in one embodiment for the display panel of the present disclosure.

As shown in FIGS. 1, 2 and 3, in the extension direction of the display layer 2, the display layer 2 may have a stretching area A. The stretching area A may include a plurality of pixel islands 100 spaced apart, and the space between the pixel islands 100 may be provided with a through-hole 200, which may be deformed so that the stretching area A may be stretched or contracted along the extension direction of the display layer 2. The stretching area A may also be bent. The through-hole 200 penetrates through the display layer 2 and exposes the flexible substrate 1. The through-hole 200 may also extend into the flexible substrate 1 or penetrate through the flexible substrate 1. The shape of the through-hole 200 is not particularly limited here, but can be extended along a folded track, depending on the space between the pixel islands 100, as long as it can make the stretching area A stretchable.

As shown in FIG. 4, the display layer 2 may include a pixel definition layer 23 having openings 231 for defining a plurality of light-emitting units 001 in the display layer 2, which may be Organic Light-Emitting Diode (OLED) light-emitting units 001, or other light-emitting devices. The light-emitting units 001 may be divided into a plurality of pixels 010, each pixel 010 including a plurality of light-emitting units 001. As shown in FIG. 3, the blocking dam 25 is in an area corresponding to the pixel island 100 and surrounding the light-emitting units 001 in the pixel island 100 in which the blocking dam 25 is located, i.e., there is a plurality of light-emitting units 001 within the annular area enclosed by the blocking dam 25.

Further, as shown in FIGS. 2-FIG. 4, each pixel island 100 has a light-emitting area 110 and an edge area 120 surrounding the light-emitting area 110. The light-emitting area 110 is an area where the pixel island 100 emits light, and the edge area 120 is an area where the pixel island 100 does not emit light. The blocking dam 25 may be in the edge area 120 and around the light-emitting area 110 and the blocking dam 25 may protrude from the light-emitting area 110 in a direction away from the flexible substrate 1. That is, each pixel island 100 has a blocking dam 25 around its light-emitting area 110. The blocking dam 25 can be used to limit the organic layer 31 of the encapsulation layer 3 to be located within the blocking dam 25, in order to achieve the encapsulation of the light-emitting area 110, while avoiding the organic layer 31 entering the through-hole 200, thus ensuring the normal stretching of the stretching area A. In this case, because the blocking dam 25 is in the edge area 120 of the pixel island 100 and around the light-emitting area 110, it will not cause obstruction to the light-emitting and will not adversely affect the encapsulation effect of the light-emitting area 110.

Figure 5:
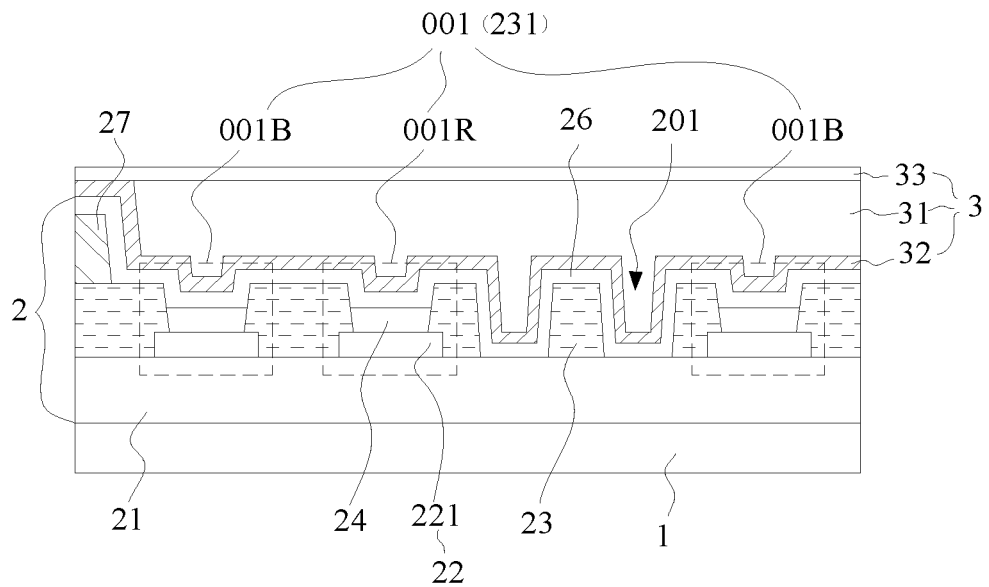
FIG. 5 illustrates a cross-sectional view of FIG. 2 in a D-D direction.
Figure 6:
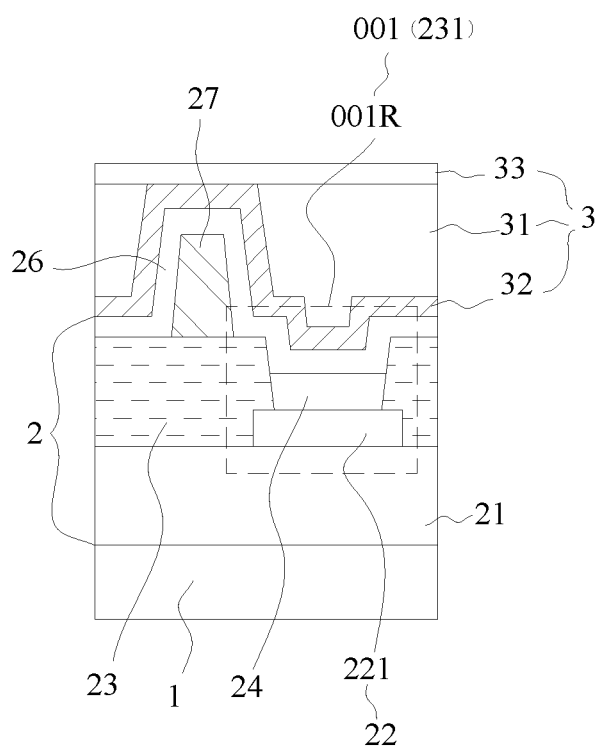
FIG. 6 illustrates a cross-sectional view of FIG. 2 in an E-E direction.

In some embodiments of the present disclosure, taking the light-emitting units 001 of the display layer 2 as OLED light-emitting units as an example, as shown in FIGS. 4-6, in a direction perpendicular to the flexible substrate 1, the display layer 2 may include a drive layer 21, a first electrode layer 22, a pixel definition layer 23, a light-emitting material layer 24, a blocking dam 25, and a second electrode layer 26.

The drive layer 21 may be provided on one side of the flexible substrate 1, for example, the drive layer 21 may be provided on a surface of the flexible substrate 1 for setting the display layer 2. In addition, the drive layer 21 may be provided with several pixel drive circuits (not shown) in one-to-one correspondence with the light-emitting units 001 for driving each light-emitting unit 001 to emit light. The specific structure of each pixel drive circuit is not particularly limited here, as long as it can be used to drive the light-emitting unit 001 to emit light.

The first electrode layer 22 may be provided on the surface of the drive layer 21 away from the flexible substrate 1. The first electrode layer 22 includes at least a plurality of first electrodes 221, and the stretching area A is provided with a plurality of first electrodes 221. Further, the light-emitting area 110 of each pixel island 100 in the stretching area A is provided with a plurality of first electrodes 221. Each first electrode 221 may serve as an anode of an OLED light-emitting unit. For example, each pixel driving circuit may be connected to the first electrode 221 of the corresponding OLED light-emitting unit to input a driving signal to the OLED light-emitting unit.

As shown in FIGS. 4-8, the pixel definition layer 23 is provided on the surface of the drive layer 21 away from the flexible substrate 1 so that the drive layer 21 is located between the flexible substrate 1 and the pixel definition layer 23, and the pixel definition layer 23 has a plurality of openings 231 that respectively expose each first electrode 221. Each light-emitting unit 001 can be defined by the pixel definition layer 23, and each opening 231 corresponds to a light-emitting unit. The range of the opening 231 defines the range of the light-emitting unit 001.

The light-emitting material layer 24 is filled within each opening 231 and is in contact with the first electrode 221, i.e., the light-emitting material layer 24 is provided on the surface of the first electrode 221 away from the flexible substrate 1. Specifically, the light-emitting material layer 24 may include a plurality of discrete light-emitting portions, each light-emitting portion is provided in the openings 231 one by one, and in contact with the first electrode 221. The light-emitting material layer 24 may be a multilayer structure, for example, the light-emitting material layer 24 may include a hole injection layer, a hole transport layer, a light-emitting function layer, an electron transport layer and an electron injection layer that are sequentially laminated on the first electrode 221.

Figure 7:
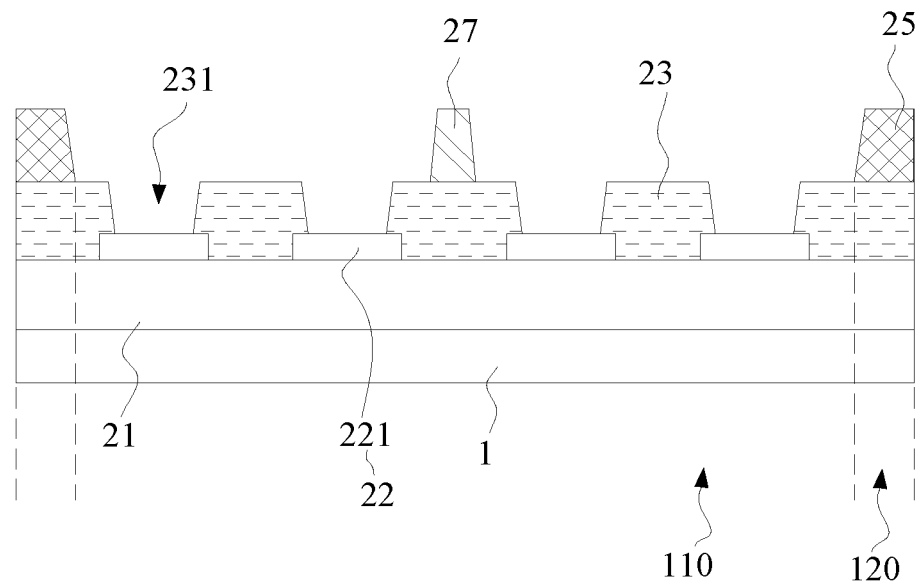
FIG. 7 illustrates a cross-sectional view of a display panel in FIG. 4 before the formation of a light-emitting material layer.

As shown in FIGS. 4 and 7, the blocking dam 25 is provided on the surface of the pixel definition layer 23 away from the drive layer 21 and is located within the stretching area A, such as within the edge area 120. The blocking dam 25 is a ring-shaped structure and surrounds the light-emitting area 110 of the pixel island 100 in which the blocking dam 25 is located, thereby surrounding the respective light-emitting units 001 in the light-emitting area 110. For example, the blocking dam 25 may be of the same material as the pixel definition layer 23 and may be formed in a single composition process, e.g., by a gray-scale masking process. The blocking dam 25 and the pixel definition layer 23 may also be formed independently.

As shown in FIGS. 4-8, the second electrode layer 26 covers the pixel definition layer 23, the light emitting material layer 24, and the blocking dam 25, and the presence of the blocking dam 25 allows the second electrode layer 26 to be raised in an area corresponding to the blocking dam 25 in the direction away from the drive layer 21 to form an annular shaped rib 101 for blocking the organic layer 31. The annular area surrounded by the rib 101 is located within the annular area surrounded by the blocking dam 25, and a portion of the organic layer 31 located in the stretching area A is confined within the annular area surrounded by the rib 101.

Each OLED light-emitting unit may include an opening 231, a first electrode 221, light-emitting material layer 24 and second electrode layer 26 corresponding to the opening 231, and each OLED light-emitting unit shares the second electrode layer 26.

In some other embodiments of the present disclosure, a hole may be made in the area of the second electrode layer 26 corresponding to the blocking dam 25, so that the blocking dam 25 protrudes from the second electrode layer 26 through the hole, which also serves to confine the organic layer 31.

As shown in FIG. 3, in each pixel island 100, the size of the rib 101 and its distance from each light-emitting unit 001 are not particularly limited here, and in some embodiments of the present disclosure, a distance S between the inner annular surface and the outer annular surface of the rib 101 ranges from 3 μm to 7 μm in the radial direction, i.e., the width of the rib 101 ranges from 3 μm to 7 μm. In addition, there is a certain distance between an orthographic projection of the inner annular surface of the rib 101 on the pixel definition layer 23 and an edge of the light-emitting units 001 surrounded by the rib 101, and the minimum distance ranges from 1 μm to 5 μm. That is, the distance W between the edge of the light-emitting unit 001 nearest to the rib 101 and the rib 101 is not less than 1 μm and not greater than 5 μm. Since the light-emitting unit 001 is defined by the opening 231, the light-emitting unit 001 may be the edge of the opening 231.

As shown in FIG. 1, the stretching area A may be the entire area of display layer 2 or a partial area of display layer 2.

For example, in some embodiments of the present disclosure, the stretching area A is a partial area of the display layer 2. That is, the display layer 2 may be divided into multiple areas along the stretch direction of the display layer 2, including the stretching area A. In this case, the display layer 2 may further include a non-stretching area B adjacent to the stretching area A. The non-stretching area B is also a flexible structure but is not stretchable, that is, the display layer 2 may not be provided with the pixel island 100 structure described above. The non-stretching area B may include a transition area B1 and a main display area B2, and the transition area B1 between the main display area B2 and the stretching area A separates the main display area B2 and the stretching area A.

Further, as shown in FIGS. 2-6, the transition area B1 and the main display area B2 also have a plurality of pixels 010, that is, the transition area B1 and the main display area B2 also have a plurality of light-emitting units 001 distributed, and the specific structure of the light-emitting unit 001 is the same as that of the light-emitting unit 001 of the stretching area A. In addition, the density of the pixels 010 of the transition area B1 is smaller than the density of the pixels 010 of the main display area B2, i.e., the density of the light-emitting units 001 of the transition area B1 is smaller than the density of the light-emitting units 001 of the main display area B2, in order to facilitate the buffering of stresses between the main display area B2 and the stretching area A.

The distribution of the pixels 010 of the display panel of the present disclosure is exemplarily described below.

As shown in FIG. 2, the light-emitting units 001 are divided into a plurality of pixels 010, and each pixel 010 includes a plurality of light-emitting units 001. The stretching area A, the transition area B1, and the main display area B2 all have a plurality of pixels 010 distributed in an array.

In some embodiments of the present disclosure, the light-emitting units 001 includes blue light-emitting units 001B, green light-emitting units 001G and red light-emitting units 001R. The pixels 010 in the stretching area A and the transition area B1 are first pixels 010a, and the pixels 010 in the main display area B2 are second pixels 010b.

A first pixel 010a includes a red light-emitting unit 001R, a green light-emitting unit 001G and a blue light-emitting unit 001B. A second pixel 010b includes a red light-emitting unit 001R, two green light-emitting units 001G and a blue light-emitting unit 001B, i.e., a GGRB distribution, which can be displayed by pixel rendering techniques.

Further, in each first pixel 010a, the red light-emitting unit 001R and the blue light-emitting unit 001B are in the same row, and the green light-emitting unit 001G is in a different row from the red light-emitting unit 001R and between the red light-emitting unit 001R and the blue light-emitting unit 001B.

In the first pixels 010a located in the same row, the red light-emitting units 001R and the blue light-emitting units 001B are in the same row, and the green light-emitting units 001G are in the same row.

A row of light-emitting units 001 in a row of the first pixels 010a is in the same row as a row of light-emitting units 001 in a row of the second pixels 010b.

In the first pixels 010a and the second pixels 010b, which are in the same column, the light-emitting units 001 with the same color are in the same column.

Since a row of light-emitting units 001 in a row of first pixels 010a is in the same row as a row of light-emitting units 001 in a row of second pixels 010b, the same mask plate may be used to form the second pixels 010b and at least a portion of the first pixels 010a when forming the openings 231. Further, each row of light-emitting units 001 in each row of first pixels 010a may be made to be located in the same row as a row of light-emitting units 001 in a row of second pixels 010b, during manufacturing, the pattern of the mask plate can be made to match the main display area B2 and the area is larger than the main display area B2 in order to cover the stretching area A and the transition area B1, and for the stretching area A and the transition area B1, the pixels 010 of the stretching area A and the transition area B1 can be formed by partially masking the mask plate. Similarly, this method may also be applicable to the light-emitting material layer 24, in order to reduce the amount of mask plate and simplify the process.

It should be noted that the pixels 010 in the embodiments of the present disclosure are only for the division of the light-emitting units 001 in the display layer 2. The image pixels in the image displayed in the display layer 2 may not be in one-to-one correspondence with the pixels 010, and the light-emitting units 001 may also be divided in other ways.

In addition, the row and column directions refer only to two directions that intersect each other, and their specific pointing is not limited in this disclosure. For example, in a rectangular display panel, the row direction may be the width direction and the column direction may be the length direction, and the actual pointing of the row and column directions may be adaptively changed after rotating the display panel.

As shown in FIG. 1, in some embodiments of the present disclosure, the shape of the display layer 2 may be a polygon, i.e., the orthographic projection of the display layer 2 on the flexible substrate 1 is a polygon, which may be a rectangle, etc. At least one top corner of the polygon may be provided with the stretching area A. For example, the shape of the display layer 2 is a rectangle, and the number of stretching areas A is four and correspondingly located at each top corner of the rectangle one by one. In this case, the stretching area A extends inwardly from the border of the display layer 2, the transition area B1 surrounds the stretching area A, and the main display area B2 surrounds the transition area B1.

Figure 9:
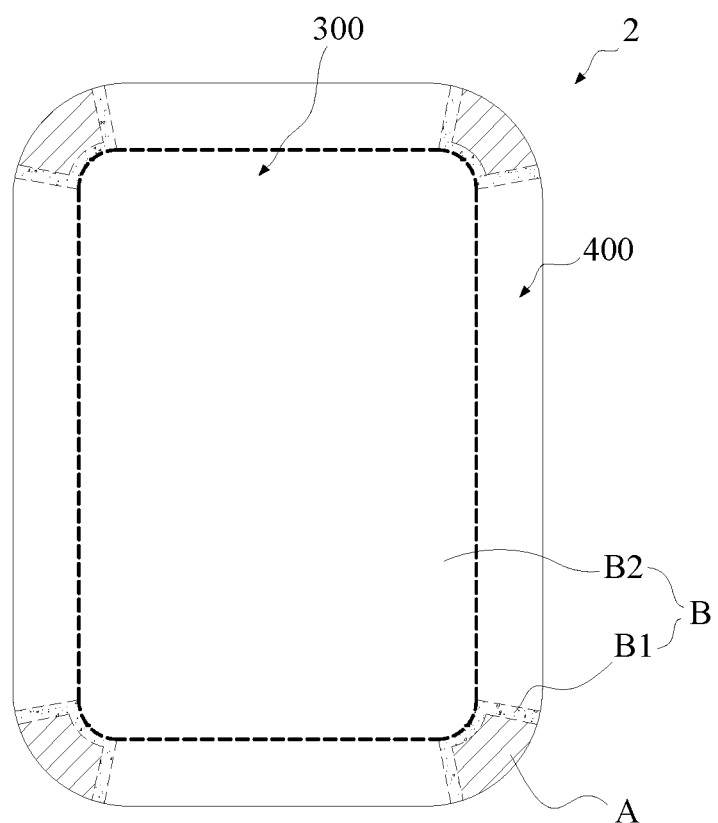
FIG. 9 illustrates a schematic diagram of the bending of a display layer in one embodiment for the display panel of the present disclosure.

Further, as shown in FIG. 9, the display layer 2 may be divided into a flat portion 300 and a bendable portion 400 surrounding the flat portion 300. The flat portion is part of the main display area B2. The stretching area A, at least part of the transition area B1, and at least part of the main display area B2 are located outside the flat portion 300 and together form a bendable portion 400. The bendable portion 400 is bendable towards the side of the flexible substrate 1 away from the display layer 2, so that all sides of the display panel are curved to increase the screen-to-body ratio. For example, the display layer 2 is rectangular in shape, and the display panel of the present disclosure may be a four-curved display panel, i.e., all four sides of the display panel are curved toward the same side of the display panel.

It should be noted that when the bendable portion 400 is bent, the flexible substrate 1 is bent together with the area corresponding to the bendable portion 400.

In some other embodiments of the present disclosure, the display layer 2 as a whole is all stretchable structure, i.e., the stretching area A is the entire area of the display layer 2, making the display panel of the present disclosure an overall stretchable flexible display panel.

In some embodiments of the present disclosure, in order to further avoid the organic layer 31 from entering the through-hole 200 of the stretching area A, as shown in FIGS. 2 and 5, at least one blocking groove 201 may be provided in the transition area B1. The blocking groove 201 recesses toward the flexible substrate 1, and a portion of the organic layer 31 in the transition area B1 is at least partially within the blocking groove. When forming the organic layer 31, the blocking groove 201 blocks the organic material and prevents the organic material from entering the through-hole 200.

The formation of the blocking groove 201 is exemplarily described below in conjunction with the specific structure of the display layer 2 of the above embodiments.

Figure 8:
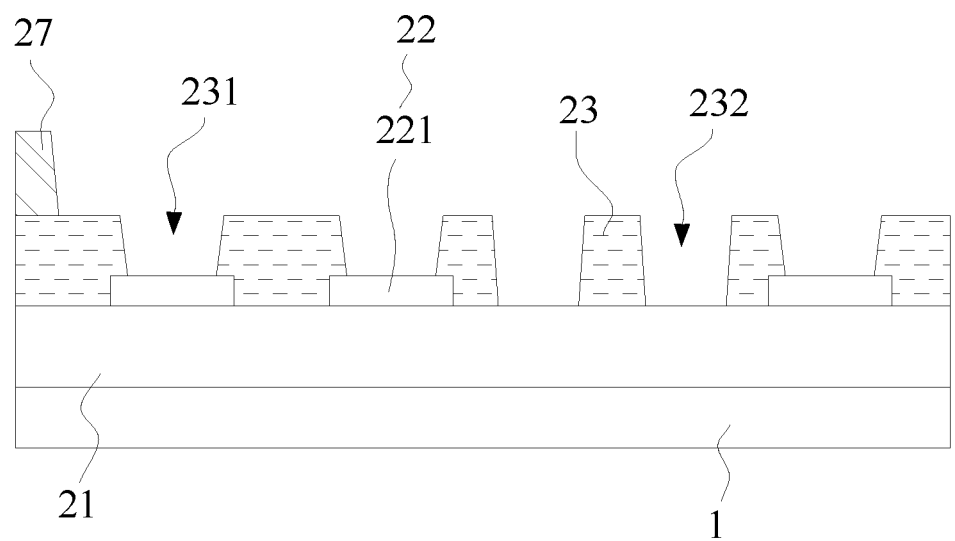
FIG. 8 illustrates a cross-sectional view of a display panel in FIG. 5 before the formation of a light-emitting material layer.

In some embodiments of the present disclosure, as shown in FIGS. 2, 5, and 8, a portion of the pixel definition layer 23 in the transition area B1 may be provided with a recess 232, and the drive layer 21 may be exposed through the recess 232. The second electrode layer 26 is recessed in the area corresponding to the recess 232 to form the blocking groove 201 that matches the recess 232. In order to ensure the continuity of the second electrode layer 26, the second electrode layer 26 does not break at the position of the blocking groove 201, i.e., the second electrode layer 26 completely covers the bottom and side walls of the recess 232.

In other embodiments of the present disclosure, instead of providing a recess 232 in the pixel definition layer 23, a blocking groove 201 may be provided directly in the second electrode layer 26. The blocking groove 201 may also serve to block the organic layer 31 without penetrating the second electrode layer 26. The blocking groove 201 may also be formed by exposing the recess 232 through a hole formed in the second electrode layer 26 in the area corresponding to the recess 232.

In some embodiments of the present disclosure, as shown in FIG. 2, there are multiple blocking grooves 201 and are divided into at least one blocking unit 210. The blocking unit 210 may include a plurality of blocking grooves 201 spaced along the column direction. When there are multiple blocking units 210, each blocking unit 210 is spaced between the stretching area A and the main display area B1.

Further, as shown in FIG. 2, a distance between two adjacent blocking grooves 201 in a same blocking unit 210 is the same as the width of the blocking groove 201 in the direction of extension of the blocking unit 210 in which the blocking groove 201 is located.

There are multiple blocking units 210 and are arranged along the row direction, and the density of blocking units 210 decreases along the row direction. In other words, along the direction from the stretching area A to the main display area B2, the number of blocking units 210 within the same size range decreases.

Furthermore, as shown in FIG. 2, the blocking groove 201 is a square groove, i.e., the orthographic projection of the blocking groove 201 on the flexible substrate 1 is square, and the side length of the square may range from 8 µm to 12 µm. The distance between two adjacent blocking grooves 201 in the same blocking unit 210 ranges from 8 µm to 12 µm, and the distance from the two adjacent blocking grooves 201 to the nearest side wall ranges from 8 µm to 12 µm.

In some other embodiments of the present disclosure, the blocking grooves 201 are continuous strips. In order to improve the blocking effect of the blocking grooves 201, both ends of the blocking grooves 201 may extend to the edge of the transition area B1, such that the organic layer 31 must pass through the blocking groove 201 to enter the stretching area A.

As shown in FIGS. 4-6, the encapsulation layer 3 may cover the surface of the display layer 2 away from the flexible substrate 1 and includes the organic layer 31. A portion of the organic layer 31 in the stretching area A is confined by each of ribs 101. In addition, a portion of the organic layer 31 in the transition area B1 is at least partially located within the blocking groove 201.

In some embodiments of the present disclosure, as shown in FIGS. 4-6, the encapsulation layer 3 may further include a first inorganic layer 32 and a second inorganic layer 33.

The first inorganic layer 32 covers the surface of the display layer 2 away from the flexible substrate 1 and is raised in an area corresponding to the blocking dam 25 and recessed in an area corresponding to the blocking groove 201. In some embodiments of the present disclosure, the through-hole 200 is exposed and does not penetrate the flexible substrate 1, and the first inorganic layer 32 is recessed into the through-hole 200 in an area corresponding to the through-hole 200, thereby covering the side walls and bottom surface of the through-hole 200 with the shape. In other embodiments of the present disclosure, the through-hole 200 penetrates the flexible substrate 1, and the first inorganic layer 32 is recessed in the area corresponding to the through-hole 200 toward the through-hole 200 and covers the sidewalls of the through-hole 200.

The organic layer 31 may be provided on the surface of the first inorganic layer 32 away from the flexible substrate 1, and the orthographic projection of the organic layer 31 on the first inorganic layer 32 is located within the boundary of the first inorganic layer 32. A portion of the organic layer 31 in the stretching area A is located within the respective ribs 101 while exposing the space between the ribs 101 and the pixel islands 100. A portion of the organic layer 31 in the non-stretching area B is a continuous whole layer structure and is at least partially located within and blocked by the blocking groove 201 in the transition area B1.

The second inorganic layer 33 may clad the organic layer 31 and in contact with the area of the first inorganic layer 32 that is not covered by the organic layer 31. For example, since the rib 101 is away from the surface of the flexible substrate 1 and there is no organic layer 31 in the through-hole 200, the first inorganic layer 32 and the second inorganic layer 33 are directly laminated in the area corresponding to the rib 101 and in the through-hole 200, i.e., they are in direct contact.

In addition, in some embodiments of the present disclosure, as shown in FIGS. 2-8, the display layer 2 may further include support columns 27, which are provided in the same layer as the blocking dam 25 on the surface of the pixel definition layer 23 away from the flexible substrate 1. The support columns 27 are provided in the stretching area A, the transition area B1 and the main display area B2 of the non-stretching area B. The second electrode layer 26 covers the support columns 27 and is attached to the support columns 27 with the shape, i.e., the second electrode layer 26 is raised in the area corresponding to the support column 27.

In some embodiments of the present disclosure, in each light-emitting area 110 of the stretching area A1, a plurality of rows of support columns 27 distributed along the column direction are provided between any two adjacent rows of first pixels 010a. Further, in each light-emitting area 110, a row of red light-emitting units 001R and blue light-emitting units 001B are provided in the same row as a row of support columns 27. A row of support columns 27 is provided between two adjacent rows of first pixels 010a.

In the transition area B1, a plurality of support columns 27 distributed along the column direction are provided between at least two adjacent rows of first pixels 010a. Further, each row of red light-emitting units 001R and blue light-emitting units 001B is provided with one row of support columns 27. A row of support columns 27 is provided between two adjacent rows of first pixels 010a.

In the main display area B2, each red light-emitting unit 001R and blue light-emitting unit 001B is provided with support columns 27 on both sides in the row direction.

In addition, the thickness of the support column 27 may be the same as the thickness of the blocking dam 25, and the support column 27 and the blocking dam 25 may be made of the same material, so that they can be formed by a single composition process to simplify the process. Further, the pixel definition layer 23, the blocking dam 25, and the support column 27 may be made of the same material and may be formed simultaneously at one time through a grayscale mask process or other processes.

It should be noted that in the embodiments of the present disclosure, the thickness direction is in the direction perpendicular to the flexible substrate 1, and the thickness of the support column 27, blocking dam 25, or other structure is in the direction perpendicular to the flexible substrate 1.

In some embodiments of the present disclosure, as shown in FIG. 3, the orthographic projection of the support column 27 on the pixel definition layer 23 may be rectangular, and the length of the short side X of the rectangle may be 10 µm and the length of the long side Y may be 20 µm.

It should be noted that FIGS. 4-6 are used only to show the cross-sectional structure of the stretching area A, transition area B1 and main display area B2 at the same time, and are not limited to the cross-sectional views obtained by direct sectioning based on FIGS. 2 and 3.

Figure 10:
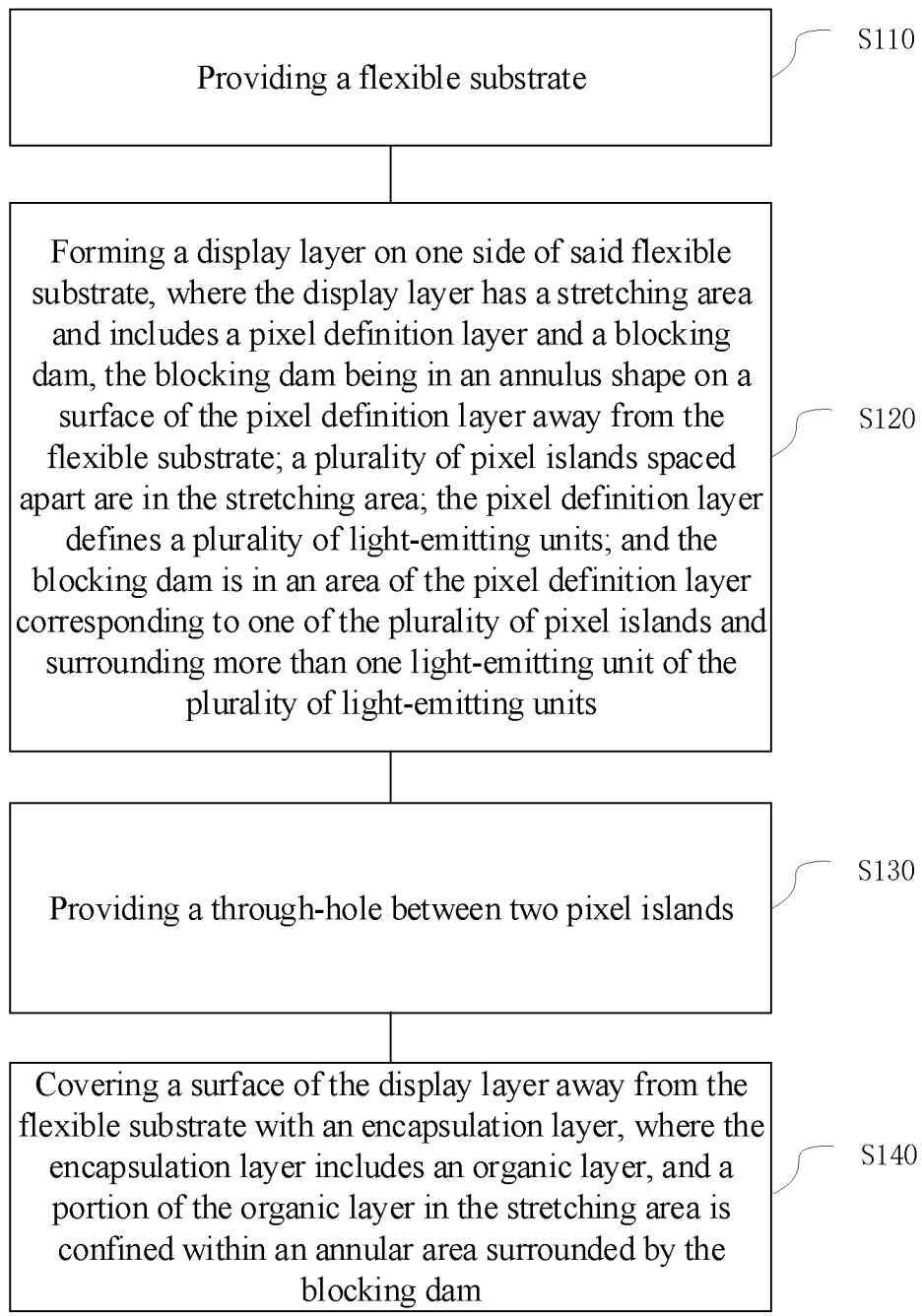
FIG. 10 illustrates a flow chart of a manufacturing method of the present disclosure in one embodiment.

The embodiments of the present disclosure provide a method for manufacturing a display panel. The display panel may be a display panel of any of the above embodiments, the structure of which is not described herein. As shown in FIG. 10, the manufacturing method may include the following steps S110-step S140.

Step S110, providing a flexible substrate.

Step S120, forming a display layer on one side of said flexible substrate, where the display layer has a stretching area and includes a pixel definition layer and a blocking dam, the blocking dam being in an annulus shape on a surface of the pixel definition layer away from the flexible substrate; a plurality of pixel islands spaced apart are in the stretching area; the pixel definition layer defines a plurality of light-emitting units; and the blocking dam is in an area of the pixel definition layer corresponding to one of the plurality of pixel islands and surrounding more than one light-emitting unit of the plurality of light-emitting units.

Step S130, providing a through-hole between two pixel islands.

Step S140, covering a surface of the display layer away from the flexible substrate with an encapsulation layer, where the encapsulation layer includes an organic layer, and a portion of the organic layer in the stretching area is confined within an annular area surrounded by the blocking dam.

The beneficial effects of the manufacturing method of the embodiments of the present disclosure are the same as the beneficial effects of the above-mentioned display panel, which can be specifically referred to the embodiments of the display panel and will not be described in detail here.

In some embodiments of the present disclosure, forming a display layer on one side of the flexible substrate, i.e., step S120, may include the following steps S1210-step S1260.

Step S1210, forming a drive layer on one side of the flexible substrate.

Step S1220, forming a first electrode layer including a plurality of first electrodes on a surface of the drive layer away from the flexible substrate, where more than one first electrode of the plurality of first electrodes is provided in a light-emitting area.

Step S1230, forming a pixel definition layer on the surface of the drive layer away from the flexible substrate, where the pixel definition layer has a plurality of openings for exposing the plurality of first electrodes, and the openings are used to define a plurality of light emitting units.

Step S1240, forming a light-emitting material layer, where the light-emitting material layer is filled within the openings and in contact with the first electrodes.

Step S1250, forming an annular blocking dam on the surface of the pixel definition layer away from the drive layer, where the blocking dam is in an edge area.

Step S1260, forming a second electrode layer covering the pixel definition layer, the light emitting material layer, and the blocking dam, where the second electrode layer is raised in an area corresponding to the blocking dam in a direction away from the drive layer 21 to form a rib being in an annulus shape.

The structure and specific details of the various parts of the display panel involved in the manufacturing method of the embodiments of the present disclosure have been described in detail in the embodiments of the display panel above, with specific reference to the embodiments of the display panel, and will not be described in detail here.

It should be noted that although the individual steps of the manufacturing method in the present disclosure are depicted in the accompanying drawings in a particular order, it is not required or implied that the steps must be performed in that order or that all the steps shown must be performed to achieve the desired result. Additional or alternatively, certain steps may be omitted, multiple steps may be combined into one step for execution, and/or one step may be broken down into multiple steps for execution, etc.

The embodiments of the present disclosure also provide a display device, which may include a display panel of any of the above embodiments. The display device may be an electronic device such as a cell phone, a television, a tablet computer, etc. The beneficial effect can be referred to the embodiments of the display panel, and will not be repeated here.

Other embodiments of the present disclosure will be readily available to those skilled in the art after considering the specification and practice of the invention disclosed herein. This application is intended to cover any variation, use, or adaptation of the present disclosure that follows the general principles of the present disclosure and includes common knowledge or conventional techniques in the art that are not disclosed herein. The specification and embodiments are deemed to be exemplary only, and the true scope and spirit of the present disclosure is indicated by the appended claims.

What is claimed is:

1. A display panel, comprising:
   a flexible substrate;
   a display layer, on one side the flexible substrate, having a stretching area, and comprising a pixel definition layer and a blocking dam, the blocking dam being in an annulus shape on a surface of the pixel definition layer away from the flexible substrate, wherein
      a plurality of pixel islands spaced apart and a through-hole between two pixel islands are in the stretching area;
      the pixel definition layer defines a plurality of light-emitting units; and
      the blocking dam is in an area of the pixel definition layer corresponding to one of the plurality of pixel islands and surrounding more than one light-emitting unit of the plurality of light-emitting units; and
   an encapsulation layer covering a surface of the display layer away from the flexible substrate and comprising an organic layer, wherein
   a portion of the organic layer in the stretching area is confined within an annular area surrounded by the blocking dam;
   wherein the display layer further comprises:
   a drive layer between the flexible substrate and the pixel definition layer;
   a first electrode layer on a surface of the drive layer away from the flexible substrate and comprising at least a plurality of first electrodes, wherein more than one first electrode of the plurality of first electrodes is in the stretching area, and the pixel definition layer has a plurality of openings for exposing the plurality of first electrodes;
   a light-emitting material layer filled within the plurality of openings and in contact with the plurality of first electrodes; and
   a second electrode layer covering the pixel definition layer, the light-emitting material layer, and the blocking dam, raised in an area corresponding to the blocking dam in a direction away from the drive layer to form a rib being in an annulus shape, wherein the portion of the organic layer in the stretching area is confined within an annular area surrounded by the rib.

2. The display panel according to claim 1, wherein the display layer further has a non-stretching area adjacent to the stretching area, and the non-stretching area comprises a transition area and a main display area; and
   the transition area is between the main display area and the stretching area and separates the main display area from the stretching area, and provided with at least one blocking groove, and a portion of the organic layer in the transition area is at least partially within the at least one blocking groove.

3. The display panel according to claim 2, wherein a portion of the pixel definition layer in the transition area is provided with a recess, and the second electrode layer forms the at least one blocking groove matching the recess in an area corresponding to the recess.

4. The display panel according to claim 2, wherein
   the plurality of light-emitting units are divided into a plurality of pixels, one of the plurality of pixels comprises more than one light-emitting unit, and the stretching area, the transition area and the main display area are provided with the plurality of pixels disposed in an array; and
   one of the plurality of light-emitting units comprises the first electrode layer, the light-emitting material layer and the second electrode layer that are corresponding to one of the plurality of openings.

5. The display panel according to claim 4, wherein a density of pixels in the transition area is equal to a density of pixels in the stretching area, and the density of pixels in the transition area and the density of pixels in the stretching area are less than a density of pixels in the main display area.

6. The display panel according to claim 4, wherein
   the plurality of light-emitting units comprise a plurality of blue light-emitting units, a plurality of green light-emitting units and a plurality of red light-emitting units;
   a pixel in the stretching area is a first pixel, a pixel in the transition area is the first pixel, and a pixel in the main display area is a second pixel; and
   the first pixel comprises a red light-emitting unit, a green light-emitting unit, and a blue light-emitting unit, and the second pixel comprises a red light-emitting unit, two green light-emitting units and a blue light-emitting unit.

7. The display panel according to claim 6, wherein
   in the first pixel, the red light-emitting unit and the blue light-emitting unit are in a same row, and the green light-emitting unit is in a different row from the red light-emitting unit and is between the red light-emitting unit and the blue light-emitting unit;
   in first pixels in a same row, red light-emitting units and blue light-emitting units are in a same row, and green light-emitting units are in a same row;
   one row of light-emitting units in one row of first pixels and one row of light-emitting units in one row of second pixels are in a same row; and
   in a same column of first pixels and second pixels, light-emitting units of a same color are in a same column.

8. The display panel according to claim 2, wherein the at least one blocking groove comprises a plurality of blocking grooves that are divided into at least one blocking unit, and the plurality of blocking grooves in the at least one blocking unit are spaced along a column direction; and the at least one blocking unit is provided between two columns of pixels.

9. The display panel according to claim 8, wherein the at least one blocking unit comprises a plurality of blocking units disposed in a row direction, and a density of the plurality of blocking units decreases from the stretching area towards the main display area.

10. The display panel according to claim 8, wherein a distance between two adjacent blocking grooves in a same blocking unit of the at least one blocking unit, is equal to, a width of one of the two adjacent blocking grooves in an extension direction of the at least one blocking unit.

11. The display panel according to claim 2, wherein the display layer is shaped as a polygon;
   at least one top corner of the polygon is provided with the stretching area, the stretching area extends inwardly from the top corner of the display layer, and the stretching area is surrounded by the transition area.

12. The display panel according to claim 11, wherein the display layer is shaped as a rectangle and provided with four stretching areas.

13. The display panel according to claim 2, wherein the display layer is further divided into a flat portion and a bendable portion surrounding the flat portion, and the bendable portion is bendable towards a side of the flexible substrate away from the display layer;
   the flat portion is part of the main display area; and
   the stretching area, at least part of the transition area and at least part of the main display area are outside the flat portion and together form the bendable portion.

14. The display panel according to claim 2, wherein the encapsulation layer further comprises:
   a first inorganic layer, covering the surface of the display layer away from the flexible substrate, raised in the area corresponding to the blocking dam, and recessed in an area corresponding to the at least one blocking groove; wherein the organic layer is on a surface of the first inorganic layer away from the flexible substrate; and
   a second inorganic layer, cladding the organic layer and in contact with the first inorganic layer in the area corresponding to the blocking dam.

15. The display panel according to claim 7, wherein the display layer further comprises a plurality of support columns, on a same layer as the blocking dam, on the surface of the pixel definition layer away from the flexible substrate, and provided in the stretching area, the transition area, and the main display area.

16. The display panel according to claim 15, wherein
   in the stretching area, a support column is in the annular area surrounded by the blocking dam, and a plurality of rows of support columns distributed along a column direction are between any two adjacent columns of first pixels; and
   in the transition area, more than one support column distributed along the column direction is between at least two adjacent columns of first pixels.

17. The display panel according to claim 15, wherein
   in the stretching area, one row of support columns is in a same row with one row of red light-emitting units and blue light-emitting units and between two adjacent rows of first pixels.

18. A method for manufacturing a display panel, comprising:
   providing a flexible substrate;
   forming a display layer on one side of the flexible substrate, wherein the display layer has a stretching area and comprises a pixel definition layer and a blocking dam, the blocking dam being in an annulus shape on a surface of the pixel definition layer away from the flexible substrate; a plurality of pixel islands spaced apart are in the stretching area; the pixel definition layer defines a plurality of light-emitting units; and the blocking dam is in an area of the pixel definition layer corresponding to one of the plurality of pixel islands and surrounding more than one light-emitting unit of the plurality of light-emitting units;

providing a through-hole between two pixel islands; and covering a surface of the display layer away from the flexible substrate with an encapsulation layer, wherein the encapsulation layer comprises an organic layer, and a portion of the organic layer in the stretching area is confined within an annular area surrounded by the blocking dam;

wherein forming the display layer on one side of the flexible substrate comprises:

forming a drive layer on one side of the flexible substrate;

forming a first electrode layer comprising a plurality of first electrodes on a surface of the drive layer away from the flexible substrate, and forming the pixel definition layer on the surface of the drive layer away from the flexible substrate, wherein more than one first electrode of the plurality of first electrodes is in the stretching area, and the pixel definition layer has a plurality of openings for exposing the plurality of first electrodes;

forming a light-emitting material layer, wherein the light-emitting material layer is filled within the plurality of openings and in contact with the plurality of first electrodes;

forming an annular blocking dam on the surface of the pixel definition layer away from the drive layer; and forming a second electrode layer covering the pixel definition layer, the light-emitting material layer, and the blocking dam, wherein the second electrode layer is raised in an area corresponding to the blocking dam in a direction away from the drive layer to form a rib being in an annulus shape, wherein the portion of the organic layer in the stretching area is confined within an annular area surrounded by the rib.

19. A display device, comprising a display panel, wherein the display panel comprises:

a flexible substrate;

a display layer, on one side the flexible substrate, having a stretching area, and comprising a pixel definition layer and a blocking dam, the blocking dam being in an annulus shape on a surface of the pixel definition layer away from the flexible substrate, wherein a plurality of pixel islands spaced apart and a through-hole between two pixel islands are in the stretching area;

the pixel definition layer defines a plurality of light-emitting units; and the blocking dam is in an area of the pixel definition layer corresponding to one of the plurality of pixel islands and surrounding more than one light-emitting unit of the plurality of light-emitting units; and an encapsulation layer covering a surface of the display layer away from the flexible substrate and comprising an organic layer, wherein a portion of the organic layer in the stretching area is confined within an annular area surrounded by the blocking dam;

wherein the display layer further comprises:

a drive layer between the flexible substrate and the pixel definition layer;

a first electrode layer on a surface of the drive layer away from the flexible substrate and comprising at least a plurality of first electrodes, wherein more than one first electrode of the plurality of first electrodes is in the stretching area, and the pixel definition layer has a plurality of openings for exposing the plurality of first electrodes;

a light-emitting material layer filled within the plurality of openings and in contact with the plurality of first electrodes; and a second electrode layer covering the pixel definition layer, the light-emitting material layer, and the blocking dam, raised in an area corresponding to the blocking dam in a direction away from the drive layer to form a rib being in an annulus shape, wherein the portion of the organic layer in the stretching area is confined within an annular area surrounded by the rib.

* * * * *